(12) United States Patent
Gupta et al.

(10) Patent No.: US 10,826,511 B1
(45) Date of Patent: Nov. 3, 2020

(54) PIPELINE ANALOG-TO-DIGITAL CONVERTER

(71) Applicant: NXP B.V., Eindhoven (NL)

(72) Inventors: Sushil Kumar Gupta, Bangalore (IN);
Pankaj Agrawal, Bangalore (IN);
Ashish Panpalia, Bangalore (IN)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/785,495

(22) Filed: Feb. 7, 2020

(51) Int. Cl.
*H03M 1/38* (2006.01)
*H03M 1/06* (2006.01)

(52) U.S. Cl.
CPC ................................. *H03M 1/0602* (2013.01)

(58) Field of Classification Search
CPC .. H03M 1/1215; H03M 1/468; H03M 1/1019;
H03M 1/12; H03M 1/164; H03M 1/1028;
H03M 1/121; H03M 1/128; H03M 1/46;
H03M 1/462; H03M 3/382; H03M 3/498;
H03M 1/66; H03M 1/0604; H03M
1/0658; H03M 1/0836; H03M 1/1245;
H03M 1/662; H03M 1/0612; H03M
1/0663; H03M 1/067; H03M 1/0675;
H03M 1/0678; H03M 1/1009; H03M
1/124; H03M 1/14; H03M 1/38; H03M
1/687; H03M 1/804; H03M 1/00; H03M
1/002; H03M 1/0695; H03M 1/123;
H03M 1/361
USPC .......................... 341/118–120, 155, 161, 162
See application file for complete search history.

(56) References Cited

U.S. PATENT DOCUMENTS

| | | | |
|---|---|---|---|
| 7,978,116 B2 | 7/2011 | Murden et al. | |
| 8,723,706 B1* | 5/2014 | Shin | H03M 1/1019 341/118 |
| 10,630,304 B1* | 4/2020 | Trivedi | H03M 1/1033 |
| 2009/0184857 A1* | 7/2009 | Furuta | H03M 1/164 341/156 |
| 2011/0115661 A1* | 5/2011 | Steensgaard-Madsen | H03M 1/162 341/155 |
| 2014/0354458 A1* | 12/2014 | Kakamu | H03M 1/129 341/122 |

(Continued)

OTHER PUBLICATIONS

Jeon, Y.-D. et al. "A 9.15mW 0.22mm2 10b 204MS/s Pipelined SAR ADC in 65nm CMOS", IEEE, 4 pgs., (2010).
U.S. Appl. No. 16/371,120, filed Apr. 1, 2019, 39 pgs.

*Primary Examiner* — Linh V Nguyen
(74) *Attorney, Agent, or Firm* — Rajeev Madnawat

(57) ABSTRACT

A pipeline analog-to-digital converter (ADC) includes a hybrid multiplying digital-to-analog converter (MDAC) that includes multiple digital-to-analog converters (DACs), an amplifier, and a conversion circuit. The multiple DACs function in a pipelined manner such that each DAC receives an analog input signal in different cycles of a clock signal and generates a corresponding analog output signal. The amplifier amplifies each analog output signal to generate a corresponding amplified analog signal in different cycles of the clock signal. The conversion circuit successively approximates each analog output signal to generate multiple digital signals. Thus, a digital output signal of the pipeline ADC is generated based on the corresponding amplified analog signal and at least one of the multiple digital signals. The pipeline ADC utilizes one cycle for performing each of sampling, conversion, and amplification operations, which results into low power consumption by the pipeline ADC.

20 Claims, 6 Drawing Sheets

(56) References Cited

U.S. PATENT DOCUMENTS

| | | | |
|---|---|---|---|
| 2015/0288380 A1* | 10/2015 | Zhao | H03M 3/37 |
| | | | 341/120 |
| 2019/0280704 A1* | 9/2019 | Bodnar | H03M 1/067 |
| 2019/0305790 A1* | 10/2019 | Kinyua | H03M 1/145 |

* cited by examiner

PIPELINE ANALOG-TO-DIGITAL CONVERTER

BACKGROUND

The present invention relates generally to electronic circuits, and, more particularly, to analog-to-digital converters.

Analog-to-digital converters (ADCs) such as pipeline ADCs include various ADC stages for achieving high speed of conversion and high resolution of the ADC. A high-powered multiplying digital-to-analog converter (MDAC) is typically implemented in the ADC stages to perform a sampling operation of an analog input signal in a half cycle of a clock signal and a conversion operation to generate a digital output signal and an analog output signal in the next half cycle of the clock signal. The analog output signal is provided to a subsequent ADC stage of the pipeline ADC. As each of the sampling and conversion operations are performed in a half cycle, a cost and a power consumption of the pipeline ADC is high due to the implementation of the high-powered MDAC.

A known solution to the aforementioned problem includes utilization of multiple sub-ADCs in a time-interleaved architecture in a pipeline ADC. In the time-interleaved pipeline ADC, the sub ADCs need to be calibrated continuously for reducing offset, gain, and skew errors that occur during the sampling and conversion operations performed by the pipeline ADC. As the sub-ADCs need to be calibrated continuously, additional components are needed for calibration in the pipeline ADC that lead to an increase in a size and a delay in a speed of operation of the pipeline ADC. Thus, there exists a need for a pipeline ADC that solves the aforementioned problems of the conventional pipeline ADCs.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION

Figure 1:
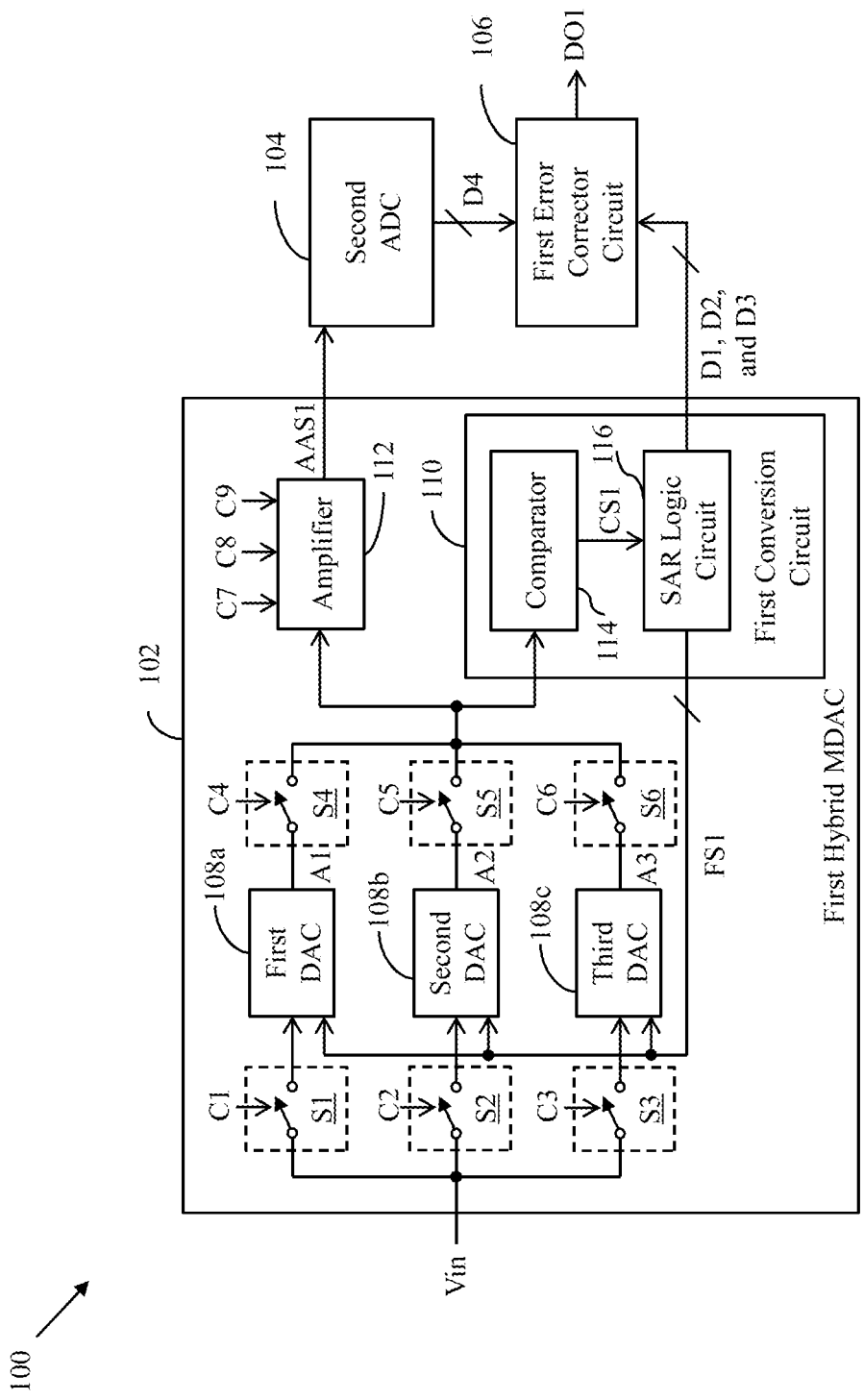
FIG. 1 is a block diagram of a first pipeline analog-to-digital converter (ADC) in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In one embodiment, the present invention provides a pipeline analog-to-digital converter (ADC). The pipeline ADC includes a first hybrid multiplying digital-to-analog converter (MDAC) that includes first through third digital-to-analog converters (DACs), an amplifier, and a conversion circuit. The first through third DACs receive an analog input signal for first through third cycles of a clock signal and generate first through third analog output signals, respectively. The first through third cycles are non-overlapping. The amplifier is coupled to the first through third DACs for receiving the first through third analog output signals, respectively. The amplifier amplifies the first through third analog output signals to generate an amplified analog signal in fourth through sixth cycles of the clock signal, respectively. The fourth through sixth cycles are non-overlapping. The conversion circuit includes a comparator and a successive approximation register (SAR) logic circuit. The comparator is coupled to the first through third DACs for receiving the first through third analog output signals, respectively. Based on at least one of the first through third analog output signals, the comparator generates a comparison signal. The SAR logic circuit is connected to the comparator for receiving the comparison signal and generates first through third digital signals in seventh through ninth cycles of the clock signal, respectively. The seventh through ninth cycles are non-overlapping.

In another embodiment, the present invention provides a pipeline ADC. The pipeline ADC includes a first hybrid MDAC that includes a coarse conversion circuit, a fine conversion circuit, an amplifier, and a first error corrector circuit. The coarse conversion circuit receives a set of analog signals and generates a set of digital signals. The fine conversion circuit is connected to the coarse conversion circuit. The fine conversion circuit includes first through fourth DACs, a comparator, and a SAR logic circuit. The first through fourth DACs receive the set of digital signals, further receive an analog input signal for first through fourth cycles of a clock signal, and generate first through fourth analog output signals, respectively. The first through fourth cycles are non-overlapping. The comparator is coupled to the first through fourth DACs for receiving the first through fourth analog output signals, respectively. Based on at least one of the first through fourth analog output signals, the comparator generates a comparison signal. The SAR logic circuit is connected to the comparator for receiving the comparison signal and generates first through fourth digital signals in fifth through eighth cycles of the clock signal, respectively. The fifth through eighth cycles are non-overlapping. The amplifier is coupled to the first through fourth DACs for receiving the first through fourth analog output signals, respectively. The amplifier amplifies the first through fourth analog output signals to generate an amplified analog signal in ninth through twelfth cycles of the clock signal, respectively. The ninth through twelfth cycles are non-overlapping. The first error corrector circuit is connected to the coarse conversion circuit for receiving the set of digital signals and is further connected to the SAR logic circuit for receiving one of the first through fourth digital signals. Based on the set of digital signals and one of the first through fourth digital signals, the first error corrector circuit generates a fifth digital signal.

Various embodiments of the present invention provide a pipeline ADC. The pipeline ADC includes a hybrid MDAC that includes multiple DACs, an amplifier, and a conversion circuit. The MDAC samples an analog input signal in corresponding non-overlapping cycles of a clock signal. Based on the sampled analog input signal, the DACs generate multiple analog signals in a pipelined manner. The generated analog signals are provided to an amplifier and a conversion circuit. The amplifier amplifies each received analog signal to generate a corresponding amplified analog signal. Further, the conversion circuit converts each analog signal to generate a corresponding digital signal in non-overlapping cycles of the clock signal.

The pipeline ADC utilizes one full cycle of the clock signal for performing each of the sampling, conversion, and amplification operations. Thus, a need for implementing a high-powered MDAC that performs sampling, conversion, and amplification operations in half cycle of a clock signal is eliminated. Further, the DACs connected in the pipeline architecture do not require continuous calibration, thus, the pipeline ADC does not include additional components for calibration due to which a size of the pipeline ADC is less as compared to conventional pipeline ADCs that include additional components for calibration. As components that perform continuous calibration of the DACs are excluded from the pipeline ADC, the pipeline ADC operates at a higher speed as compared to the conventional pipeline ADCs.

Referring now to FIG. 1, a block diagram of a first pipeline analog-to-digital converter (ADC) 100 in accordance with an embodiment of the present invention is shown. The first pipeline ADC 100 receives an analog input signal Vin from a first functional circuitry (not shown). The first functional circuitry may be any analog circuitry that generates the analog input signal yin that is indicative of a test signal, a functional signal, or the like. The first pipeline ADC 100 converts the analog input signal Vin to generate a first digital output signal DO1. The first pipeline ADC 100 may provide the first digital output signal DO1 to a second functional circuitry (not shown). The second functional circuitry may be any digital circuitry that receives the first digital output signal DO1 and performs operations related to display, testing, or the like. In an embodiment, the first and second functional circuitries and the first pipeline ADC 100 are included on a system-on-chip (SoC) (not shown).

The first pipeline ADC 100 includes multiple ADC stages such as a first hybrid multiplying digital-to-analog converter (MDAC) 102 and a second ADC 104 that are arranged in a pipeline architecture, and a first error corrector circuit 106. The first pipeline ADC 100 may further include a first clock generator circuit (not shown). In one embodiment, the first clock generator circuit is internal to the first hybrid MDAC 102. In another embodiment, the first clock generator circuit is external to the first hybrid MDAC 102.

The first clock generator circuit generates an input clock signal (shown later in FIGS. 2, 3, and 5). In the presently preferred embodiment, the first clock generator circuit further generates first through ninth clock signals C1-C9. In one example, the first through ninth clock signals C1-C9 are derived from the input clock signal by altering time durations of the input clock signal differently for each of the first through ninth clock signals C1-C9. The second through ninth clock signals C2-C9 may be delayed versions of the first clock signal C1 such that the time duration for which the first through ninth clock signals C1-C9 remain at logic high state is less than a time duration for which the first through ninth clock signals C1-C9 remain at logic low state. Further, first through ninth cycles of the input clock signal represent each time duration for which the first through ninth clock signals C1-C9 remain at logic high state, respectively. The first through third cycles are non-overlapping, the fourth through sixth cycles are non-overlapping, and the seventh through ninth cycles are non-overlapping. The first, sixth, and eighth cycles overlap with each other, i.e., the first, sixth, and eighth clock signals C1, C6, and C8 transition from one logic state (such as logic low state) to another logic state (such as logic high state) simultaneously. Further, the second, fourth, and ninth cycles overlap with each other, and the third, fifth, and seventh cycles overlap with each other. In another embodiment, the first pipeline ADC 100 includes second through tenth clock generator circuits (not shown) that receive the input clock signal and generate the first through ninth clock signals C1-C9, respectively.

It will be apparent to those of skill in the art that although in the current embodiment, the first through ninth cycles of the input clock signal represent each time duration for which the first through ninth clock signals C1-C9 remain at logic high state, respectively, in an alternate embodiment, the first through ninth cycles of the input clock signal represent each time duration for which the first through ninth clock signals C1-C9 remain at logic low state, respectively.

The first hybrid MDAC 102 includes first through third switches S1-S3, first through third digital-to-analog converters (DACs) 108*a*-108*c*, fourth through sixth switches S4-S6, a first conversion circuit 110, and an amplifier 112. The first through third switches S1-S3 are connected to the first functional circuitry for receiving the analog input signal Vin, and further receive the first through third clock signals C1-C3, respectively. The first through third switches S1-S3 are activated in the first through third cycles of the input clock signal, i.e., when the first through third clock signals C1-C3 are at logic high state, respectively.

It will be apparent to those of skill in the art that although in the current embodiment, the first through third switches S1-S3 are activated when the first through third clock signals C1-C3 are at logic high state, respectively, in an alternate embodiment, the first through third switches S1-S3 are activated when the first through third clock signals C1-C3 are at logic low state, respectively. In one example, each switch is a p-channel metal oxide semiconductor transistor. In another example, each switch is a n-channel metal oxide semiconductor transistor.

The first through third switches S1-S3 receive and sample the analog input signal Vin when the first through third switches S1-S3 are activated, respectively. The first through third switches S1-S3 are connected to the first through third DACs 108*a*-108*c* to provide the sampled analog input signal Yin, respectively. In the presently preferred embodiment, though the first through third switches S1-S3 are internal to the first hybrid MDAC 102 and external to the first through third DACs 108*a*-108*c*, in another embodiment, the first through third switches S1-S3 are external to the first hybrid MDAC 102. In yet another embodiment, the first through third switches S1-S3 are internal to the first through third DACs 108*a*-108*c*, respectively.

The first through third DACs 108*a*-108*c* are connected in a pipeline architecture and receive the sampled analog input signal Vin for the first through third cycles of the input clock signal, i.e., when the first through third switches S1-S3 are activated, respectively. Further, the first through third DACs 108*a*-108*c* generate first through third analog output signals A1-A3 on receiving the sampled analog input signal Vin, respectively. In the presently preferred embodiment, the first through third DACs 108*a*-108*c* are capacitive DACs that include a set of capacitors (not shown). Each of the first through third DACs 108a-108c further receives a first feedback signal FS1. The first feedback signal FS1 controls charging and discharging of the set of capacitors, i.e., controls the first through third DACs 108a-108c, for generating the first through third analog output signals A1-A3, respectively. It will be apparent to those of skill in the art that although in the current embodiment the first hybrid MDAC 102 includes the first through third DACs 108a-108c, in alternate embodiments, the first hybrid MDAC 102 may include more than three DACs without deviating from the scope of the present invention.

The fourth through sixth switches S4-S6 are connected to the first through third DACs 108a-108c for receiving the first through third analog output signals A1-A3, and further receive the fourth through sixth clock signals C4-C6, respectively. The fourth through sixth switches S4-S6 are activated in the fourth through sixth cycles of the input clock signal, i.e., when the fourth through sixth clock signals C4-C6 are at logic high state, respectively. The fourth switch S4 receives and outputs the first analog output signal A1 when the fourth switch S4 is activated. Similarly, the fifth and sixth switches S5 and S6 receive and output the second and third analog output signals A2 and A3 when the fifth and sixth switches S5 and S6 are activated, respectively. The fourth through sixth switches S4-S6 are connected to the first conversion circuit 110 and the amplifier 112 to provide the first through third analog output signals A1-A3, respectively.

It will be apparent to those of skill in the art that although in the current embodiment, the fourth through sixth switches S4-S6 are activated when the fourth through sixth clock signals C4-C6 are at logic high state, respectively, in an alternate embodiment, the fourth through sixth switches S4-S6 are activated when the fourth through sixth clock signals C4-C6 are at logic low state, respectively.

The first conversion circuit 110 is coupled to the first through third DACs 108a-108c by way of the fourth through sixth switches S4-S6 for receiving the first through third analog output signals A1-A3, respectively. The first conversion circuit 110 converts the first through third analog output signals A1-A3 to generate first through third digital signals D1-D3 in the fourth through sixth cycles, respectively. Further, the first feedback signal FS1 is generated and provided by the first conversion circuit 110 to control the first through third DACs 108a-108c.

The first conversion circuit 110 includes a comparator 114 and a successive approximation register (SAR) logic circuit 116. The comparator 114 is connected to the fourth through sixth switches S4-S6. Thus, the comparator 114 is coupled to the first through third DACs 108a-108c for receiving the first through third analog output signals A1-A3, by way of the fourth through sixth switches S4-S6, respectively. The comparator 114 generates a first comparison signal CS1 based on at least one of the first through third analog output signals A1-A3.

To generate the first comparison signal CS1, the comparator 114 receives and compares at least one of the first through third analog output signals A1-A3 with a first reference signal (not shown) when one of the fourth through sixth switches S4-S6 is activated, respectively. The first reference signal is generated by a reference signal generator (not shown). In one embodiment, the reference signal generator corresponds to a bandgap circuit. Further, a voltage level of the first reference signal is equal to a common mode voltage level of the analog input signal Vin when the first through third DACs 108a-108c are top-plate sampling DACs. Alternatively, when the first through third DACs 108a-108c are bottom-plate sampling DACs, the first reference signal is at a voltage level that is half of a supply voltage (not shown). The comparator 114 compares one of the first through third analog output signals A1-A3 with the first reference signal at each cycle of a comparison clock signal (not shown). In an example, when the fourth switch S4 is activated, the comparator 114 compares the first analog output signal A1 with the first reference signal to generate the first comparison signal CS1. The number of cycles for comparison are based on the number of bits of one of the first through third digital signals D1-D3. In an example, the comparator 114 performs the comparison for M-cycles of the comparison clock signal when the corresponding digital signal includes M-bits. In an embodiment, the comparison clock signal is generated by the first clock generator circuit.

The SAR logic circuit 116 is connected to the comparator 114 for receiving the first comparison signal CS1. The comparator 114 and the SAR logic circuit 116 successively approximate the first through third analog output signals A1-A3 to generate the first through third digital signals D1-D3, respectively. The SAR logic circuit 116 generates the first feedback signal FS1 at each cycle of the comparison clock signal. The SAR logic circuit 116 is connected to the first through third DACs 108a-108c for providing the first feedback signal FS1. After each cycle of the comparison clock signal, the SAR logic circuit 116 generates a corresponding bit of one of the first through third digital signals D1-D3. Thus, after M-cycles of the comparison clock signal, the SAR logic circuit 116 completes generation of the M-bits of one of the first through third digital signals D1-D3. The SAR logic circuit 116 generates the first through third digital signals D1-D3 in the fourth through sixth cycles of the input clock signal, respectively. The first through third digital signals D1-D3 include first through third sets of bits such that most significant bits (MSBs) of the first digital output signal DO1 correspond to at least one of the first through third sets of bits. In one example, each of the first through third sets of bits includes N-bits.

The amplifier 112 is coupled to the first through third DACs 108a-108c for receiving the first through third analog output signals A1-A3, by way of the fourth through sixth switches S4-S6, respectively. The amplifier 112 further receives the seventh through ninth clock signals C7-C9. The seventh through ninth clock signals C7-C9 control an amplification operation of the amplifier 112. The amplifier 112 amplifies the first through third analog output signals A1-A3 to generate a first amplified analog signal AAS1 in the seventh through ninth cycles of the input clock signal, i.e., when the seventh through ninth clock signals C7-C9 are at logic high states, respectively. In one embodiment, the amplifier 112 amplifies the first through third analog output signals A1-A3 after the SAR logic circuit 116 generates the first through third digital signals D1-D3, respectively.

The second ADC 104 is connected to the amplifier 112 for receiving the first amplified analog signal AAS1. The second ADC 104 generates a fourth digital signal D4 by converting the first amplified analog signal AAS1. In an embodiment, the second ADC 104 is structurally and functionally similar to the first hybrid MDAC 102. In another embodiment, the second ADC 104 is a sub-ranging SAR ADC (not shown). The fourth digital signal D4 includes a fourth set of bits such that least significant bits (LSBs) of the first digital output signal DO1 correspond to the fourth set of bits. In one example, the fourth set of bits includes M-bits.

The first error corrector circuit 106 is connected to the SAR logic circuit 116 for receiving one of the first through third digital signals D1-D3. The first error corrector circuit 106 is further connected to the second ADC 104 for receiving the fourth digital signal D4. In one example, the first error corrector circuit 106 receives the first and fourth digital signals D1 and D4. The first error corrector circuit 106 compares the LSB of the first digital signal D1 with the MSB of the fourth digital signal D4 to determine whether the LSB of the first digital signal D1 matches the MSB of the fourth digital signal D4. Based on the determination, the first error corrector circuit 106 checks whether the first and fourth digital signals D1 and D4 are error-free or erroneous. The first and fourth digital signals D1 and D4 are error-free when the LSB of the first digital signal D1 matches the MSB of the fourth digital signal D4. The first and fourth digital signals D1 and D4 are erroneous when the LSB of the first digital signal D1 does not match with the MSB of the fourth digital signal D4. The first error corrector circuit 106 further corrects the errors in at least one of the first and fourth digital signals D1 and D4 when at least one of the first and fourth digital signals D1 and D4 are erroneous. The first error corrector circuit 106 generates and outputs the first digital output signal DO1 based on the first and fourth digital signals D1 and D4 when the first and fourth digital signals D1 and D4 are error-free. It will be apparent to a person skilled in the art that the number of bits of the first digital output signal DO1 are based on the number of bits of the first and fourth digital signals D1 and D4. In an example, when the first digital signal D1 is of N-bits and the fourth digital signal D4 is of M-bits, the first digital output signal DO1 is of (N+M−1) bits. It will be apparent to those of skill in the art that when the first error corrector circuit 106 receives one of the second and third digital signals D2 and D3, the first error corrector circuit 106 generates the first digital output signal DO1 based on one of the second and third digital signals D2 and D3 in a manner similar to the generation of the first digital output signal DO1 based on the first digital signal D1.

Figure 2:
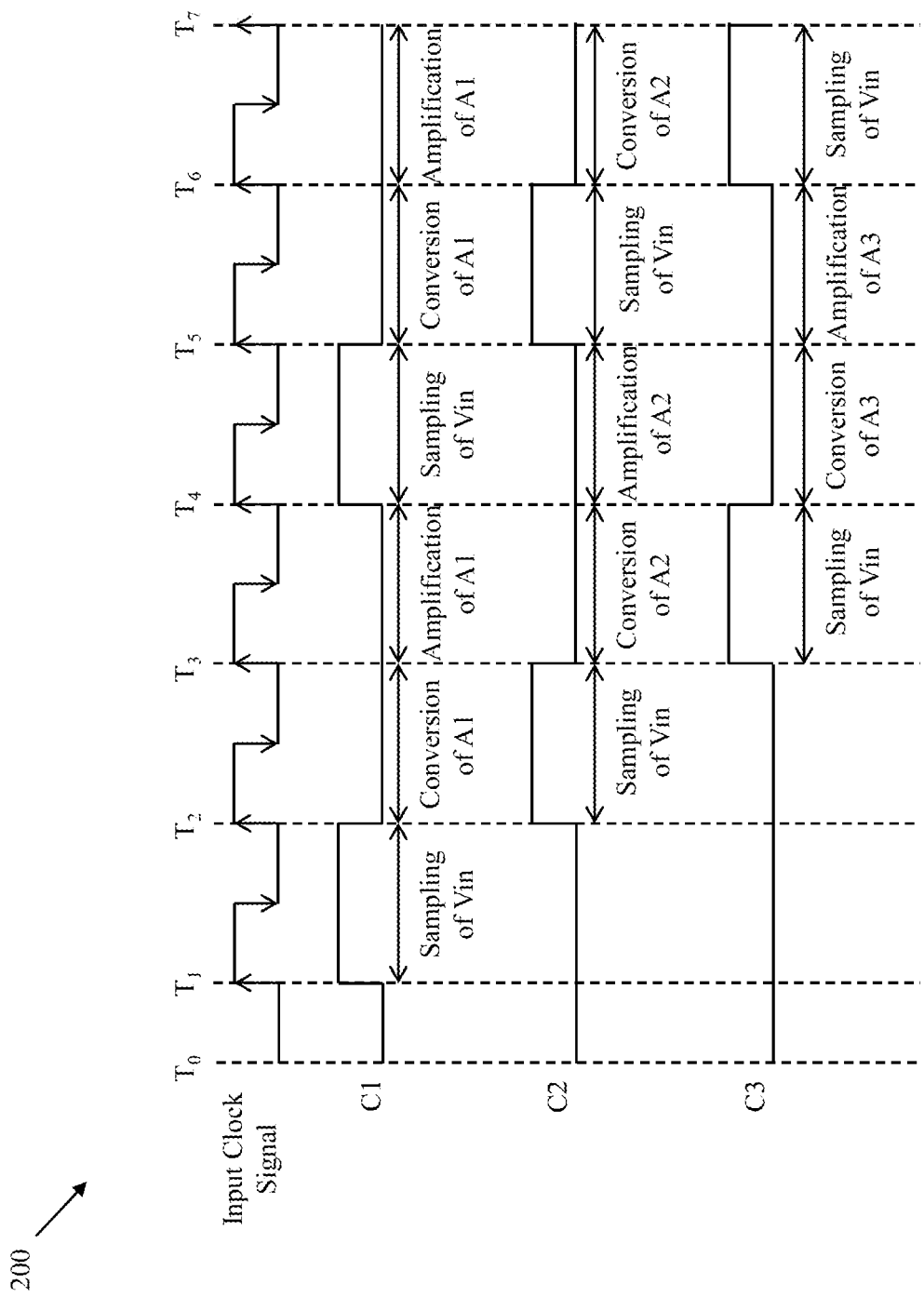
FIG. 2 is a timing diagram that illustrates an operation of the first pipeline ADC of FIG. 1 in accordance with an embodiment of the present invention.

Referring now to FIG. 2, a timing diagram 200 illustrating an operation of the first pipeline ADC 100 in accordance with an embodiment of the present invention is shown.

At time instance T0, the first through third clock signals C1-C3 are at logic low state. During time period T0-T1, the first through third clock signals C1-C3 remain at logic low state. Thus, the first through third switches S1-S3 are deactivated.

At time instance T1, the first clock signal C1 transitions from logic low state to logic high state. During time period T1-T2, the first clock signal C1 remains at logic high state, and the second and third clock signals C2 and C3 remain at logic low state. The first switch S1 is thus activated and the second and third switches S2 and S3 remain deactivated. The first switch S1 performs sampling of the analog input signal Yin. Further, the first DAC 108a receives the analog input signal yin and generates the first analog output signal A1.

At time instance T2, the first clock signal C1 transitions from logic high state to logic low state, thereby deactivating the first switch S1. Further, the second clock signal C2 transitions from logic low state to logic high state, thereby activating the second switch S2. During time period T2-T3, the second clock signal C2 remains at logic high state, and the first and third clock signals C1 and C3 remain at logic low state. Thus, the second switch S2 and the first switch S1 remain activated and deactivated, respectively, and the third switch S3 remains deactivated. The second switch S2 performs sampling of the analog input signal Vin. As the fourth cycle overlaps with the second cycle, the second DAC 108b receives the analog input signal Vin and generates the second analog output signal A2 and the first conversion circuit 110 performs conversion of the first analog output signal A1 to generate the first digital signal D1, simultaneously.

At time instance T3, the second clock signal C2 transitions from logic high state to logic low state, thereby deactivating the second switch S2. Further, the third clock signal C3 transitions from logic low state to logic high state, thereby activating the third switch S3. During time period T3-T4, the third clock signal C3 remains at logic high state, and the first and second clock signals C1 and C2 remain at logic low state. Thus, the third switch S3 and the second switch S2 remain activated and deactivated, respectively, and the first switch S1 remains deactivated. The third switch S3 performs sampling of the analog input signal Vin. As the fifth and seventh cycles overlap with the third cycle, the third DAC 108c generates the third analog output signal A3, the first conversion circuit 110 performs conversion of the second analog output signal A2 to generate the second digital signal D2, and the amplifier 112 performs amplification of the first analog output signal A1, simultaneously.

At time instance T4, the third clock signal C3 transitions from logic high state to logic low state, thereby deactivating the third, switch S3. Further, the first clock signal C1 transitions from logic low state to logic high state, thereby activating the first switch S1. During time period T4-T5, the first clock signal C1 remains at logic high state, and the second and third clock signals C2 and C3 remain at logic low state. Thus, the first switch S1 and the third switch S3 remain activated and deactivated, respectively, and the second switch S2 remains deactivated. The first switch S1 performs sampling of the analog input signal Vin. Further, the first DAC 108a receives the analog input signal yin and generates the first analog output signal A1. As the sixth and eighth cycles overlap with the first cycle, the sixth switch S6 thus receives the third analog output signal A3. The first conversion circuit 110 thus performs conversion of the third analog output signal A3 to generate the third digital signal D3. Further, the amplifier 112 performs amplification of the second analog output signal A2.

At time instance T5, the first clock signal C1 transitions from logic high state to logic low state, thereby deactivating the first switch S1. Further, the second clock signal C2 transitions from logic low state to logic high state, thereby activating the second switch S2. During time period T5-T6, the second clock signal C2 remains at logic high state, and the first and third clock signals C1 and C3 remain at logic low state. Thus, the second switch S2 and the first switch S1 remain activated and deactivated, respectively, and the third switch S3 remains deactivated. The second switch S2 performs sampling of the analog input signal Vin. Further, the second DAC 108b receives the analog input signal yin and generates the second analog output signal A2. As the fourth and ninth cycles overlap with the second cycle, the fourth switch S4 receives the first analog output signal A1. The first conversion circuit 110 thus performs conversion of the first analog output signal A1 to generate the first digital signal D1. Further, the amplifier 112 performs amplification of the third analog output signal A3.

At time instance T6, the second clock signal C2 transitions from logic high state to logic low state, thereby deactivating the second switch S2. Further, the third clock signal C3 transitions from logic low state to logic high state, thereby activating the third switch S3. During time period T6-T7, the amplification of the first analog output signal A1, the conversion of the second analog output signal A2, and the sampling of the analog input signal Vin occurs in a similar manner as that during the time period T3-T4.

Figure 3:
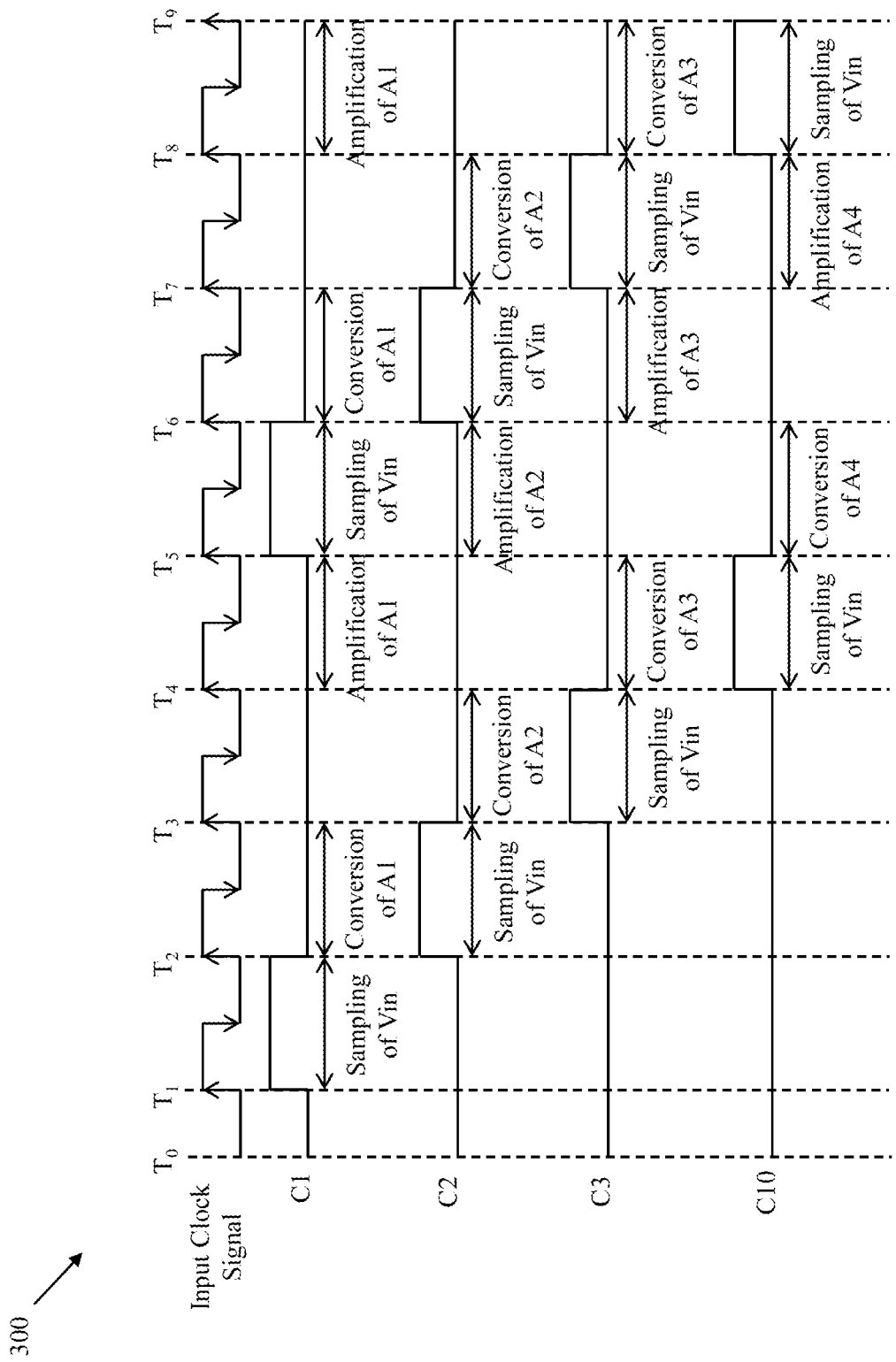
FIG. 3 is a timing diagram that illustrates an operation of the first pipeline ADC of FIG. 1 in accordance with another embodiment of the present invention.

Referring now to FIG. 3, a timing diagram 300 illustrating an operation of the first pipeline ADC 100 in accordance with another embodiment of the present invention is shown. In the embodiment, the first hybrid MDAC 102 includes seventh and eighth switches (shown later in FIGS. 4A and 4B) and a fourth DAC (shown later in FIGS. 4A and 4B) that is connected in a pipeline architecture with the first through third DACs 108a-108c. The seventh and eighth switches receive a tenth clock signal C10 and an eleventh clock signal (not shown) which are derived from the input clock signal in a manner similar to the derivation of the first through ninth clock signals C1-C9. Similarly, the amplifier receives a twelfth clock signal (not shown) that is derived from the input clock signal in a manner similar to the derivation of the first through ninth clock signals C1-C9. In one embodiment, the first clock generator circuit generates the tenth clock signal C10 and the eleventh and twelfth clock signals. In another embodiment, the first pipeline ADC 100 includes eleventh through thirteenth clock generator circuits (not shown) that receive the input clock signal and generate the tenth clock signal C10 and the eleventh and twelfth clock signals, respectively. The seventh switch is structurally and functionally similar to the first through third switches S1-S3. The eighth switch is structurally and functionally similar to the fourth through sixth switches S4-S6. The fourth DAC is structurally and functionally similar to the first through third DACs 108a-108c.

At time instance T0, the first through third clock signals C1-C3 and the tenth clock signal C10 are at logic low state. During time period T0-T1, the first through third clock signals C1-C3 and the tenth clock signal C10 remain at logic low state. Thus, the first through third switches S1-S3 and the seventh switch are deactivated.

During time period T1-T5, the first through third switches S1-S3 perform sampling of the analog input signal Vin and the first conversion circuit 110 performs the conversion of the first through third analog output signals A1-A3 as described in FIG. 2. Further, during time period T4-T5, the amplifier 112 amplifies the first analog output signal A1 and the seventh switch performs sampling of the analog input signal Yin.

During time period T5-T9 and during the time period T1-T5, the first through third switches S1-S3 perform sampling of the analog input signal Vin and the first conversion circuit 110 performs the conversion of the first through third analog output signals A1-A3 in a similar manner. Further, during time period T5-T6, the amplifier 112 amplifies the second analog output signal A2 and the first conversion circuit 110 performs conversion of the fourth analog output signal A4 to generate a fifth digital signal. During time period T6-T7 and during time period T7-T8, the amplifier 112 amplifies the third and fourth analog output signal A3 and A4, respectively. During time period T8-T9, the amplifier 112 amplifies the first analog output signal A1 and the seventh switch performs sampling of the analog input signal Vin in a similar manner as that performed during the time period T4-T5.

The time duration for which each of the first, second, third, and tenth clock signals C1, C2, C3, and C10 remain at logic low state corresponds to three cycles of the input clock signal, i.e., the time duration between two sampling operations is three cycles. Thus, three cycles may be utilized by the first pipeline ADC 100 for converting the analog input signal Vin to the first digital output signal DO1 and amplifying one of the first through fourth analog output signals A1-A4.

It will further be understood by a person skilled in the art that when the first pipeline ADC 100 is implemented with five DACs, the time duration between two sampling operations is four full cycles of the input clock signal. Thus, four cycles may be utilized by the first pipeline ADC 100 for the conversion and amplification operations.

Figure 4A:
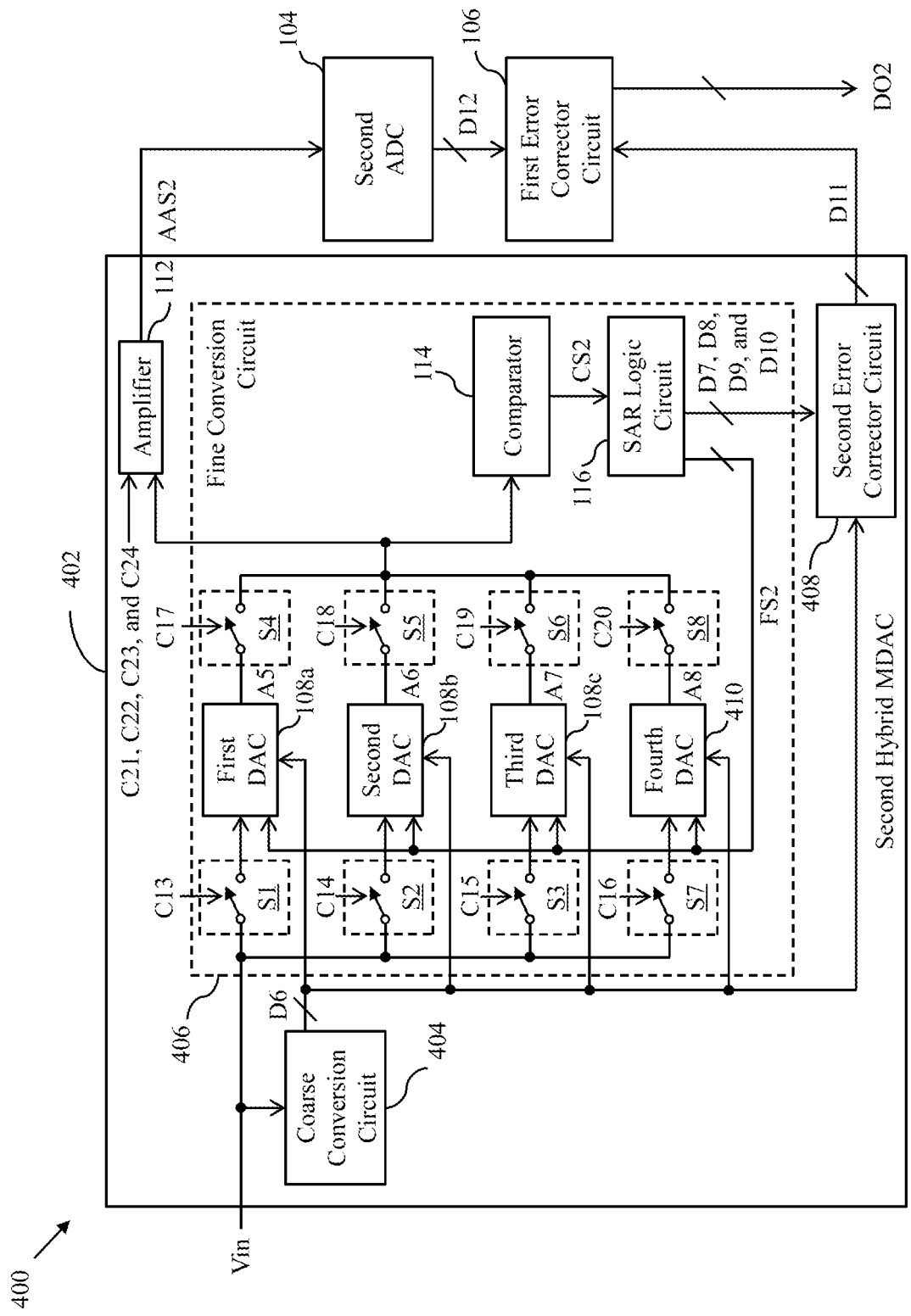
FIG. 4A is a block diagram of a second pipeline ADC in accordance with another embodiment of the present invention.

Referring now to FIG. 4A, a block diagram of a second pipeline ADC 400 in accordance with another embodiment of the present invention is shown. The second pipeline ADC 400 receives a set of analog signals that includes the analog input signal Vin generated by the first functional circuitry. The second pipeline ADC 400 converts the analog input signal yin to generate a second digital output signal D02. The second pipeline ADC 400 may provide the second digital output signal DO2 to the second functional circuitry.

The second pipeline ADC 400 includes multiple ADC stages such as a second hybrid MDAC 402 and the second ADC 104 that are arranged in a pipeline architecture, and the first error corrector circuit 106. The first clock generator circuit may be internal or external to the second pipeline ADC 400. In the presently preferred embodiment, the first clock generator circuit further generates thirteenth through twenty-fourth clock signals C13-C24 in a manner similar to the generation of the first through ninth clock signals C1-C9. The thirteenth through sixteenth cycles are non-overlapping, the seventeenth through twentieth cycles are non-overlapping, and the twenty-first through twenty-fourth cycles are non-overlapping. The thirteenth, twentieth and twenty-third cycles overlap with each other, i.e., the thirteenth, twentieth and twenty-third clock signals C13, C20, and C23 transition from one logic state (such as logic low state) to another logic state (such as logic high state) simultaneously. Further, the fourteenth, seventeenth, and twenty-fourth cycles overlap with each other, the fifteenth, eighteenth, and twenty-first cycles overlap with each other, and the sixteenth, nineteenth, and twenty-second cycles overlap with each other.

The second hybrid MDAC 402 includes a coarse conversion circuit 404, a fine conversion circuit 406, the amplifier 112, and a second error corrector circuit 408. In the embodiment, the coarse conversion circuit 404 receives the analog input signal Vin and performs coarse conversion to generate a set of digital signals that includes a sixth digital signal D6. In one example, the coarse conversion circuit 404 is implemented as a flash ADC. The fine conversion circuit 406 is connected to the coarse conversion circuit 404 for receiving the sixth digital signal D6. The fine conversion circuit 406 further receives the analog input signal yin. The coarse conversion circuit 404 generates the sixth digital signal D6 in a single cycle of the input clock signal.

The fine conversion circuit 406 is connected to the coarse conversion circuit 404, and includes the first through sixth switches S1-S6, the seventh and eighth switches S7 and S8, the first through third DACs 108a-108c, the fourth DAC 410, the comparator 114, and the SAR logic circuit 116. The first through third switches S1-S3 and the seventh switch S7 are connected to the first functional circuitry for receiving the analog input signal Vin, and further receive the thirteenth through sixteenth clock signals C13-C16, respectively. The first through third switches S1-S3 and the seventh switch S7 are activated in the thirteenth through sixteenth cycles of the input clock signal, i.e., when the thirteenth through sixteenth clock signals C13-C16 are at logic high state, to receive and sample the analog input signal Yin, respectively. The first through third switches S1-S3 and the seventh switch S7 are connected to the first through third DACs 108a-108c and the fourth DAC 410 to provide the sampled analog input signal yin, respectively. In another embodiment, the first through third switches S1-S3 and the seventh switch S7 are external to the fine conversion circuit 406.

The first through third DACs 108a-108c and the fourth DAC 410 are connected in a pipeline architecture and receive the sampled analog input signal Vin for the thirteenth through sixteenth cycles of the input clock signal, i.e., when the first through third switches S1-S3 and the seventh switch S7 are activated, respectively. Each of the first through third DACs 108a-108c and the fourth DAC 410 are connected to the coarse conversion circuit 404 for receiving the set of digital signals, i.e., the sixth digital signal D6, and further receive a second feedback signal FS2. Further, the first through third DACs 108a-108c and the fourth DAC 410 generate fifth through eighth analog output signals A5-A8, respectively. The functioning of the second feedback signal FS2 is similar to the functioning of the first feedback signal FS1.

The fourth through sixth switches S4-S6 and the eighth switch S8 are connected to the first through third DACs 108a-108c and the fourth DAC 410 for receiving the fifth through eighth analog output signals A5-A8, and further receive the seventeenth through twentieth clock signals C17-C20, respectively. The fourth through sixth switches S4-S6 and the eighth switch S8 are activated in the seventeenth through twentieth cycles of the input clock signal, i.e., when the seventeenth through twentieth clock signals C17-C20 are at logic high state, to receive and output the fifth through eighth analog output signals A5-A8, respectively. The fourth through sixth switches S4-S6 and the eighth switch S8 are connected to the comparator 114 and the amplifier 112 to provide the fifth through eighth analog output signals A5-A8, respectively.

The comparator 114 is coupled to the first through third DACs 108a-108c and the fourth DAC 410 for receiving the fifth through eighth analog output signals A5-A8, by way of the fourth through sixth switches S4-S6 and the eighth switch S8, respectively. The comparator 114 generates a second comparison signal CS2 based on at least one of the fifth through eighth analog output signals A5-A8.

To generate the second comparison signal CS2, the comparator 114 receives and compares at least one of the fifth through eighth analog output signals A5-A8 with a second reference signal (not shown) when one of the fourth through sixth switches S4-S6 and the eighth switch S8 is activated, respectively. The second reference signal may be generated by the reference signal generator. A voltage level of the second reference signal is equal to the common mode voltage level of the analog input signal Yin when the first through third DACs 108a-108c and the fourth DAC 410 are top-plate sampling DACs. Alternatively, when the first through third DACs 108a-108c and the fourth DAC 410 are bottom-plate sampling DACs, the second reference signal is at a voltage level that is half of the supply voltage. The comparator 114 generates the second comparison signal CS2 in a manner similar to the generation of the first comparison signal CS1.

The SAR logic circuit 116 is connected to the comparator 114 for receiving the second comparison signal CS2. The SAR logic circuit 116 generates one of seventh through tenth digital signals D7-D10 in the seventeenth through twentieth cycles of the input clock signal, respectively, in a manner similar to the generation of the first through third digital signals D1-D3. The SAR logic circuit 116 generates second feedback signal FS2 at each cycle of the comparison clock signal. The SAR logic circuit 116 is further connected to the first through third DACs 108a-108c and the fourth DAC 410 for providing the second feedback signal FS2.

The second error corrector circuit 408 is connected to the coarse conversion circuit 404 for receiving the set of digital signals, i.e., the sixth digital signal D6, and the SAR logic circuit 116 for receiving one of the seventh through tenth digital signals D7-D10. The second error corrector circuit 408 generates and outputs an eleventh digital signal D11 based on the sixth digital signal D6 and one of the seventh through tenth digital signals D7-D10 in a manner similar to the generation of the first digital output signal DO1. The eleventh digital signal D11 includes a fifth set of bits such that MSBs of the second digital output signal DO2 correspond to the fifth set of bits.

The amplifier 112 is coupled to the first through third DACs 108a-108c for receiving the fifth through eighth analog output signals A5-A8, by way of the fourth through sixth switches S4-S6 and the eighth switch S8, respectively. The amplifier 112 further receives the twenty-first through twenty-fourth clock signals C21-C24 and amplifies the fifth through eighth analog output signals A5-A8 to generate a second amplified analog signal AAS2 in the twenty-first through twenty-fourth cycles of the input clock signal, respectively.

The second ADC 104 is connected to the amplifier 112 for receiving the second amplified analog signal AAS2. The second ADC 104 generates a twelfth digital signal D12 by converting the second amplified analog signal AAS2. In an embodiment, the second ADC 104 is structurally and functionally similar to the first hybrid MDAC 102 or the second hybrid MDAC 402. In another embodiment, the second ADC 104 is a sub-ranging SAR ADC (not shown). The twelfth digital signal D12 includes a sixth set of bits such that LSBs of the second digital output signal DO2 correspond to the sixth set of bits.

The first error corrector circuit 106 is connected to the second error corrector circuit 408 for receiving the eleventh digital signal D11, and the second ADC 104 for receiving the twelfth digital signal D12. The first error corrector circuit 106 generates the second digital output signal DO2 based on the eleventh and twelfth digital signals D11 and D12 in a manner similar to the generation of the first digital output signal D01.

Figure 4B:
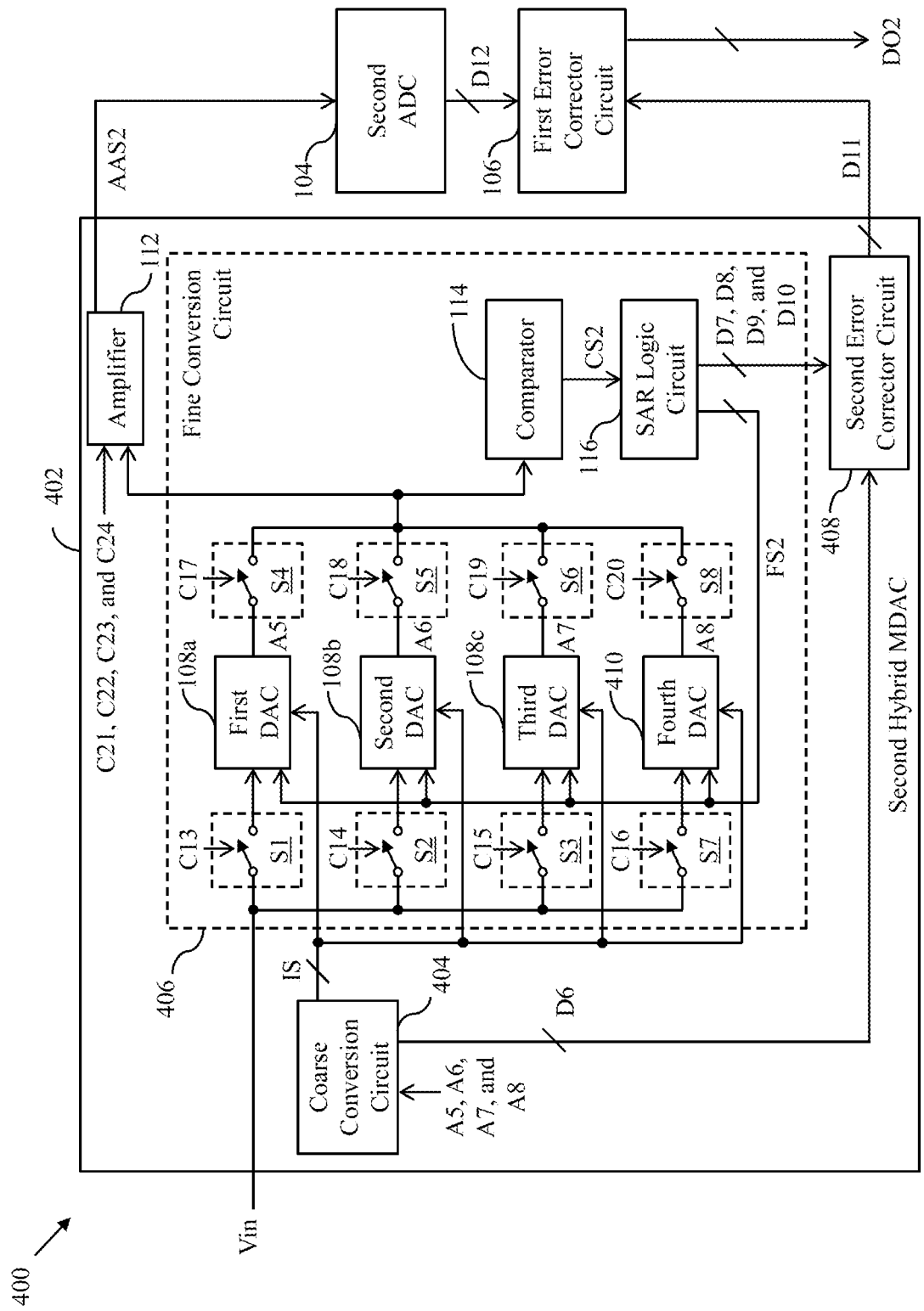
FIG. 4B is a block diagram of the second pipeline ADC of FIG. 4A in accordance with yet another embodiment of the present invention.

Referring now to FIG. 4B, a block diagram of the second pipeline ADC 400 in accordance with yet another embodiment of the present invention. In the embodiment, the coarse conversion circuit 404 is implemented as a SAR ADC and shares the first through third DACs 108a-108c and the fourth DAC 410 of the fine conversion circuit 406 for performing coarse conversion. The coarse conversion circuit 404 is connected to the first through third DACs 108a-108c and the fourth DAC 410 for receiving a set of analog signals (such as the fifth through eighth analog output signals A5-A8), respectively. Based on one of the fifth through eighth analog output signals A5-A8, the coarse conversion circuit 404 generates a set of digital signals, i.e., an intermediate signal IS and the sixth digital signal D6. The first through third DACs 108a-108c and the fourth DAC 410 receive the intermediate signal IS that controls the generation of the fifth through eighth analog output signals A5-A8, respectively. The sixth digital signal D6 is generated by converting one of the fifth through eighth analog output signals A5-A8. The coarse conversion circuit 404 generates the sixth digital signal D6 and the intermediate signal IS in a single cycle of the input clock signal. The second error corrector circuit 408 is connected to the coarse conversion circuit 404 for receiving the sixth digital signal D6 and generates the eleventh digital signal D11 in a manner similar as described in FIG. 4A. The fine conversion circuit 406, the amplifier 112, the second ADC 104, and the first error corrector circuit 106 function in a similar manner as described in FIG. 4A.

Figure 5:
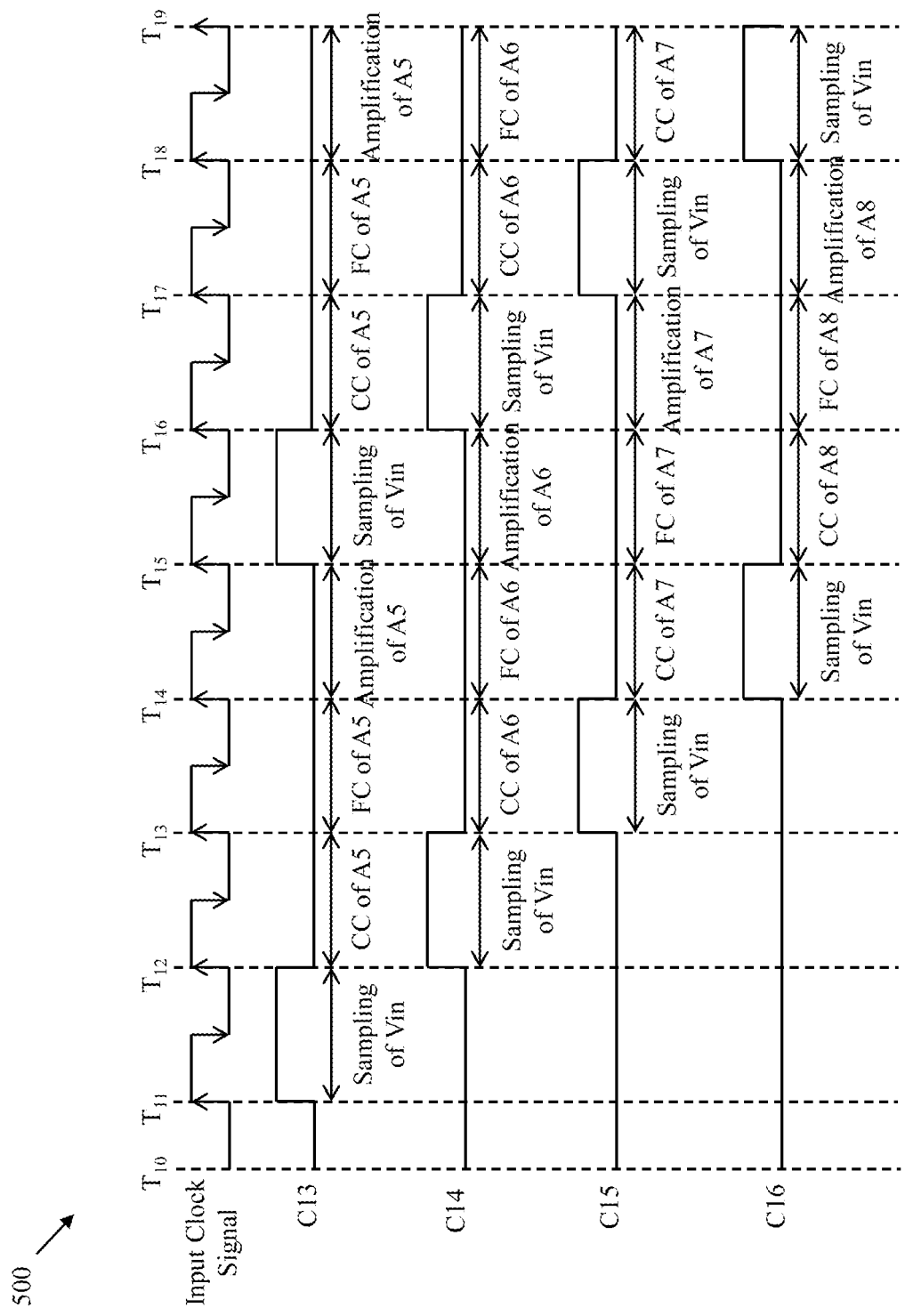
FIG. 5 is a timing diagram that illustrates an operation of the second pipeline ADC of FIGS. 4A and 4B in accordance with another embodiment of the present invention.

Referring now to FIG. 5, a timing diagram 500 illustrating an operation of the second pipeline ADC 400 of FIGS. 4A and 4B in accordance with another embodiment of the present invention is shown.

At time instance 110, the thirteenth through sixteenth clock signals C13-C16 are at logic low state, thus, the first through third switches S1-S3 and the seventh switch S7 are deactivated. During time period T10-T11, the thirteenth through sixteenth clock signals C13-C16 remain at logic low state and the first through third switches S1-S3 and the seventh switch S7 remain deactivated.

At time instance T11, the thirteenth clock signal C13 transitions from logic low state to logic high state, thereby activating the first switch S1, During time period T11-T12, the thirteenth clock signal C13 remains at logic high state, and the fourteenth through sixteenth clock signals C14-C16 remain at logic low state. Thus, the first switch S1 remains activated and the second, third and seventh switches S2, S3, and S7 remain deactivated. The first switch S1 thus performs sampling of the analog input signal Vin. Further, the first DAC 108a receives the analog input signal Vin and generates the fifth analog output signal A5.

At time instance T12, the thirteenth clock signal C13 transitions from logic high state to logic low state, thereby deactivating the first switch S1. Further, the fourteenth clock signal C14 transitions from logic low state to logic high state, thereby activating the second switch S2. During time period T12-T13, the fourteenth clock signal C14 remains at logic high state, and the thirteenth, fifteenth, and sixteenth clock signals C13, C15, and C16 remain at logic low state. Thus, the second switch S2 remains activated, and the first, third, and seventh switches S1, S3 and S7 remain deactivated. The second switch S2 thus performs sampling of the analog input signal Vin. Further, the second DAC 108b receives the analog input signal Vin and generates the sixth analog output signal A6. In reference to FIG. 4A, the coarse conversion circuit 404 performs coarse conversion (represented as "CC" in FIG. 5) of the analog input signal Vin to generate the sixth digital signal D6. In reference to FIG. 4B, the coarse conversion circuit 404 performs coarse conversion (represented as "CC" in FIG. 5) of the fifth analog output signal A5 to generate the sixth digital signal D6.

At time instance T13, the fourteenth clock signal C14 transitions from logic high state to logic low state, thereby deactivating the second switch S2. Further, the fifteenth clock signal C15 transitions from logic low state to logic high state, thereby activating the third switch S3. During time period T13-T14, the fifteenth clock signal C15 remains at logic high state, and the thirteenth, fourteenth, and sixteenth clock signals C13, C14, and C16 remain at logic low state. Thus, the third switch S3 remains activated, and the first, second, and seventh switches S1, S2, and S7 remain deactivated. The third switch S3 performs sampling of the analog input signal Yin. Further, the third DAC 108c receives the analog input signal Yin and generates the seventh analog output signal A7. In reference to FIG. 4A, the coarse conversion circuit 404 performs coarse conversion of the analog input signal Yin to generate the sixth digital signal D6. In reference to FIG. 4B, the coarse conversion circuit 404 performs coarse conversion of the sixth analog output signal A6 to generate the sixth digital signal D6.

As the fourteenth cycle overlaps with the seventeenth cycle, the fourth switch S4 thus receives the fifth analog output signal A5 and the fine conversion circuit 406 performs fine conversion (represented as "FC" in FIG. 5) of the fifth analog output signal A5.

At time instance T14, the fifteenth clock signal C15 transitions from logic high state to logic low state, thereby deactivating the third switch S3. Further, the sixteenth clock signal C16 transitions from logic low state to logic high state, thereby activating the seventh switch S7. During time period T14-T15, the sixteenth clock signal C16 remains at logic high state, and the thirteenth through fifteenth clock signals C13-C15 remain at logic low state. Thus, the seventh switch S7 remains activated, and the first through third switches S1-S3 remain deactivated. The seventh switch S7 performs sampling of the analog input signal Yin. Further, the fourth DAC 410 receives the analog input signal Vin and generates the eighth analog output signal A8. In reference to FIG. 4A, the coarse conversion circuit 404 performs coarse conversion of the analog input signal Yin to generate the sixth digital signal D6. In reference to FIG. 4B, the coarse conversion circuit 404 performs coarse conversion of the seventh analog output signal A7 to generate the sixth digital signal D6.

As the fifteenth, eighteenth, and twenty-first cycles overlap with each other, the seventh switch S7 performs sampling of the analog input signal Yin, and the fourth DAC 410 generates the eighth analog output signal A8, simultaneously. Further, the fine conversion circuit 406 generates the ninth digital output signal D9, and the amplifier 112 performs amplification of the fifth analog output signal A5, simultaneously.

During time period T15-T19 and during the time period T11-T15, the sampling of the analog input signal Yin, the coarse conversion of the fifth analog output signal A5, the fine conversion of the fifth analog output signal A5, and the amplification of the fifth analog output signal A5 occur in a similar manner. Further, during the time period T15-T19, the amplification of the sixth analog output signal A6, the sampling of the analog input signal Yin, the coarse conversion of the sixth analog output signal A6, and the fine conversion of the sixth analog output signal A6 occur in a manner similar to the amplification of the fifth analog output signal A5, the sampling the analog input signal Vin, and the coarse and fine conversions of the fifth analog output signal A5 during the time period T14-T18, respectively. In addition, during the time period T15-T19, the fine conversion and amplification of the seventh analog output signal A7, the sampling of the analog input signal Vin, and the coarse conversion of the seventh analog output signal A7 occurs as well as the coarse conversion, the fine conversion, and the amplification of the eighth analog output signal A8, and the sampling of the analog input signal yin occurs.

The first and second pipeline ADCs 100 and 400 utilize at least one full cycle of the input clock signal to perform each of the sampling, conversion, and amplification operations as compared to half cycles of an input clock signal that are utilized for performing sampling and conversion by the conventional pipeline ADCs. As need for implementing high powered components (that perform the aforementioned operations in half cycle of the clock signal) in the first and second pipeline ADCs 100 and 400 is eliminated, the first and second pipeline ADCs 100 and 400 consume low power, have low cost, and operate at a higher speed as compared to conventional pipeline ADCs that implement high-powered components. Further, multiple DACs (such as the first through third DACs 108a-108c) are implemented in a pipeline architecture in a hybrid MDAC (such as the first hybrid MDAC 102) as compared to implementation of ADCs in a time-interleaved architecture that require continuous calibration for reducing the offset, gain, and skew errors. As no additional components are required by the first and second pipeline ADCs 100 and 400 for calibration, a size of the first and second pipeline ADCs 100 and 400, and hence an area occupied by the first and second pipeline ADCs 100 and 400 on an SoC is less as compared to conventional ADCs that implement additional components for calibration.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A pipeline analog-to-digital converter (ADC), comprising:
 a first hybrid multiplying digital-to-analog converter (MDAC) that comprises:
  first through third digital-to-analog converters (DACs) that receive an analog input signal for first through third cycles of a clock signal, and generate first through third analog output signals, respectively, wherein the first through third cycles are non-overlapping;
  an amplifier that is coupled to the first through third DACs for receiving the first through third analog output signals, respectively, and amplifies the first through third analog output signals to generate an amplified analog signal in fourth through sixth cycles of the clock signal, respectively, wherein the fourth through sixth cycles are non-overlapping; and
  a conversion circuit comprising:
   a comparator that is coupled to the first through third DACs for receiving the first through third analog output signals, respectively, and generates a comparison signal based on at least one of the first through third analog output signals; and
   a successive approximation register (SAR) logic circuit that is connected to the comparator for receiving the comparison signal and generates first through third digital signals in seventh through ninth cycles of the clock signal, respectively, wherein the seventh through ninth cycles are non-overlapping.

2. The pipeline ADC of claim 1, wherein when the second cycle overlaps with the seventh cycle, the second DAC generates the second analog output signal and the SAR logic circuit generates the first digital signal, simultaneously.

3. The pipeline ADC of claim 1, wherein when the third, fourth, and eighth cycles overlap with each other, the third DAC generates the third analog output signal, the SAR logic circuit generates the second digital signal, and the amplifier amplifies the first analog output signal, simultaneously.

4. The pipeline ADC of claim 1, wherein the amplifier amplifies the first through third analog output signals after the SAR logic circuit generates the first through third digital signals, respectively.

5. The pipeline ADC of claim 1, further comprising:
 a second ADC that is connected to the amplifier for receiving the amplified analog signal, and generates a fourth digital signal based on the amplified analog signal; and
 an error corrector circuit that is connected to the SAR logic circuit for receiving one of the first through third digital signals, is further connected to the second ADC for receiving the fourth digital signal, and generates a digital output signal based on the fourth digital signal and one of the first through third digital signals.

6. The pipeline ADC of claim 5, wherein the first through fourth digital signals include first through fourth sets of bits, respectively, and wherein most significant bits (MSBs) of the digital output signal correspond to one of the first through third sets of bits, and least significant bits (LSBs) of the digital output signal correspond to the fourth set of bits.

7. The pipeline ADC of claim 1, wherein the first hybrid MDAC further comprises:
 first through third switches that are activated in the first through third cycles, receive the analog input signal, and are connected to the first through third DACs to provide the analog input signal, respectively.

8. The pipeline ADC of claim 1, wherein the first hybrid MDAC further comprises:
 fourth through sixth switches that are activated in the seventh through ninth cycles, are connected to the first through third DACs for receiving the first through third analog output signals, and are further connected to the comparator and the amplifier for providing the first through third analog output signals, respectively.

9. The pipeline ADC of claim 1, wherein the first through third DACs are connected in a pipeline architecture.

10. The pipeline ADC of claim 1, wherein the SAR logic circuit further generates a feedback signal, and is connected to the first through third DACs for providing the feedback signal, and wherein the feedback signal controls the first through third DACs for generating the first through third analog output signals, respectively.

11. A pipeline analog-to-digital converter (ADC), comprising:
 a first hybrid multiplying digital-to-analog converter (MDAC) that comprises:
  a coarse conversion circuit that receives a set of analog signals, and generates a set of digital signals;
  a fine conversion circuit that is connected to the coarse conversion circuit, the fine conversion circuit comprising:
   first through fourth digital-to-analog converters (DACs) that receive the set of digital signals, further receive an analog input signal for first through fourth cycles of a clock signal, and generate first through fourth analog output signals, respectively, wherein the first through fourth cycles are non-overlapping;
   a comparator that is coupled to the first through fourth DACs for receiving the first through fourth analog output signals, respectively, and generates a comparison signal based on at least one of the first through fourth analog output signals; and
   a successive approximation register (SAR) logic circuit that is connected to the comparator for receiving the comparison signal and generates first through fourth digital signals in fifth through eighth cycles of the clock signal, respectively, wherein the fifth through eighth cycles are non-overlapping;
  an amplifier that is coupled to the first through fourth DACs for receiving the first through fourth analog output signals, respectively, and amplifies the first through fourth analog output signals to generate an amplified analog signal in ninth through twelfth cycles of the clock signal, respectively, wherein the ninth through twelfth cycles are non-overlapping; and a first error corrector circuit that is connected to the coarse conversion circuit for receiving the set of digital signals, is further connected to the SAR logic circuit for receiving one of the first through fourth digital signals, and generates a fifth digital signal based on the set of digital signals and one of the first through fourth digital signals.

12. The pipeline ADC of claim 11, wherein the set of analog signals includes the analog input signal, and the set of digital signals includes a sixth digital signal.

13. The pipeline ADC of claim 11, wherein the set of analog signals includes the first through fourth analog output signals, and wherein the set of digital signals includes an intermediate signal and a sixth digital signal.

14. The pipeline ADC of claim 13, wherein the first through fourth DACs receive the intermediate signal, and the first error corrector circuit receives the sixth digital signal.

15. The pipeline ADC of claim 11, wherein when the fourth, sixth, and ninth cycles overlap with each other, the coarse conversion circuit generates the set of digital signals, the fourth DAC generates the fourth analog output signal, the SAR logic circuit generates the third digital signal, and the amplifier amplifies the first analog output signal, simultaneously.

16. The pipeline ADC of claim 11, further comprising:
a second ADC that is connected to the amplifier for receiving the amplified analog signal, and generates a seventh digital signal; and
a second error corrector circuit that is connected to the first error corrector circuit and the second ADC for receiving the fifth and seventh digital signals, respectively, and generates a digital output signal, wherein the fifth and seventh digital signals include first and second sets of bits, respectively, and wherein most significant bits (MSBs) of the digital output signal correspond to the first set of bits, and least significant bits (LSBs) of the digital output signal correspond to the second set of bits.

17. The pipeline ADC of claim 11, wherein the fine conversion circuit further comprises:
first through fourth switches that are activated in the first through fourth cycles, receive the analog input signal, and are connected to the first through fourth DACs to provide the analog input signal, respectively.

18. The pipeline ADC of claim 11, wherein the fine conversion circuit further comprises:
fifth through eighth switches that are activated in the fifth through eighth cycles, are connected to the first through fourth DACs for receiving the first through fourth analog output signals, and are further connected to the comparator and the amplifier for providing the first through fourth analog output signals, respectively.

19. The pipeline ADC of claim 11, wherein the SAR logic circuit further generates a feedback signal, and is connected to the first through fourth DACs for providing the feedback signal, and wherein the feedback signal controls the first through fourth DACs for generating the first through fourth analog output signals, respectively.

20. The pipeline ADC of claim 11, wherein the coarse conversion circuit generates the set of digital signals in a single cycle of the clock signal.

* * * * *